(12) United States Patent
Alfke

(10) Patent No.: US 7,667,500 B1
(45) Date of Patent: Feb. 23, 2010

(54) GLITCH-SUPPRESSOR CIRCUITS AND METHODS

(75) Inventor: Peter H. Alfke, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 164 days.

(21) Appl. No.: 11/599,113

(22) Filed: Nov. 14, 2006

(51) Int. Cl.
*G01R 29/02* (2006.01)
*H03K 9/00* (2006.01)
(52) U.S. Cl. .......................................... 327/34; 326/28
(58) Field of Classification Search .................. 327/34, 327/217, 551; 326/26–29
See application file for complete search history.

(56) References Cited

U.S. PATENT DOCUMENTS

| | | | | |
|---|---|---|---|---|
| 3,753,014 A | * | 8/1973 | Kronies et al. ................ | 326/51 |
| 4,471,235 A | * | 9/1984 | Sakhuja et al. ................ | 327/34 |
| 5,059,818 A | * | 10/1991 | Witt et al. ..................... | 327/175 |
| 5,389,843 A | * | 2/1995 | McKinney ................... | 327/276 |
| 5,406,216 A | * | 4/1995 | Millman et al. ............. | 327/202 |
| 5,815,016 A | * | 9/1998 | Erickson ...................... | 327/158 |
| 6,184,735 B1 | * | 2/2001 | Kobayashi ................... | 327/276 |
| 6,353,341 B1 | * | 3/2002 | Lesea et al. .................... | 327/34 |
| 6,535,024 B1 | * | 3/2003 | Rochard ....................... | 327/34 |
| 6,867,627 B1 | * | 3/2005 | Murtagh ...................... | 327/158 |
| 6,995,554 B2 | * | 2/2006 | Loke et al. ................ | 324/76.54 |
| 2003/0237012 A1 | * | 12/2003 | Jahagirdar et al. .......... | 713/500 |
| 2006/0038599 A1 | * | 2/2006 | Avants et al. ................ | 327/276 |
| 2006/0082391 A1 | * | 4/2006 | Hsu et al. ...................... | 327/34 |
| 2006/0145727 A1 | * | 7/2006 | Sribhashyam et al. ......... | 327/34 |

* cited by examiner

*Primary Examiner*—Lincoln Donovan
*Assistant Examiner*—Thomas J Hiltunen
(74) *Attorney, Agent, or Firm*—Lois D. Cartier; LeRoy D. Maunu

(57) ABSTRACT

Circuits and methods of suppressing signal glitches in an integrated circuit (IC). A glitch on a signal entering a clock buffer, for example, is prevented from propagating through the clock buffer. In some embodiments, a latch is added to an input clock path that detects a transition on the input signal, and then ignores any subsequent transitions for a time delta that is determined by a delay circuit. In some embodiments, a multiplexer circuit is used to select between the input clock signal and the output clock signal, with changes on the input clock signal not being passed through the multiplexer circuit unless the time delta has already elapsed. In some embodiments, the delay is programmable, pin-selectable, or self-adapting.

18 Claims, 4 Drawing Sheets

GLITCH-SUPPRESSOR CIRCUITS AND METHODS

FIELD OF THE INVENTION

The invention relates to integrated circuit devices (ICs). More particularly, the invention relates to circuits and methods of suppressing glitches in IC signals, e.g., clock signals.

BACKGROUND

Integrated circuits (ICs) are typically clocked devices. In other words, an input clock signal is typically provided to an IC and is distributed throughout the IC, where it controls the timing of signal interactions throughout the circuitry. Therefore, a clock signal is arguably one of the most important signals in the entire IC.

Clock integrity is very important for reliable system operation. Data signals tend to be fairly non-critical, e.g., timing jitter and amplitude spikes on a data signal typically do not matter except at the moment when the data is being clocked into a storage cell or flip-flop. However, an input clock signal can come from any of several sources, e.g., internal to the IC, external to the IC, an external microprocessor, and so forth. Some of these signal sources might provide clock signals that are small and weak. For example, the configuration process in a programmable logic device (PLD) is often controlled by a configuration clock signal generated by a microprocessor external to the PLD. In these circumstances, it is not uncommon for the configuration clock signal to be a weak signal with slow transitions. Further, some clock signals, such as configuration clock signals for PLDs, are typically routed in a chain to many ICs, precluding simple serial termination.

The situation is exacerbated by the shrinking transistor geometries and reduced operating voltages evinced by modern ICs. As transistors get faster, for example, a clock input may become vulnerable to sporadic fast transients caused by Simultaneously Switching Outputs (SSOs) or by PC-board reflections. A sub-nanosecond perturbation in an input clock signal can cause on-chip double-triggering if the glitch propagates into the clock structure of the IC. In other words, a signal intended to be a single clock pulse might appear at the input clock terminal as two clock pulses, with undesirable effects. In a typical synchronous system, most signal inputs are inherently insensitive to perturbations that occur shortly after the clock edge, but the clock signal itself is always very sensitive to such perturbations.

Transient noise on an input clock signal can be difficult to detect directly, even with a high-quality oscilloscope. However, it must be corrected to ensure correct operation of the IC. Therefore, attempts are often made to correct clock signal integrity using, for example, low-pass filtering and Schmitt triggers. However, such solutions cause delay and have proven inadequate under some circumstances.

Therefore, it is desirable to provide simple and effective solutions that will suppress noise on input signals, particularly input clock signals.

SUMMARY OF THE INVENTION

The invention provides circuits and methods of suppressing signal glitches (temporary perturbations) in an integrated circuit (IC). A glitch on a signal entering a clock buffer, for example, is prevented from propagating through the clock buffer. In some embodiments, a latch is added to an input clock path that detects a transition on the input signal, and then ignores any subsequent transitions for a time delta that is determined by a delay circuit. In some embodiments, a multiplexer circuit is used to select between the input clock signal and the output clock signal, with changes on the input clock signal not being passed through the multiplexer circuit unless the time delta has already elapsed. Unlike conventional filtering methods, these methods cause almost no delay for the active clock edge, while they can suppress glitches of any predetermined duration.

In some embodiments, the delay is programmable, pin-selectable, or self-adapting.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for suppressing glitches in an input clock signal. However, the present invention is not limited to clock signals, but can be used for any input signal. Further, as required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

Figure 1:
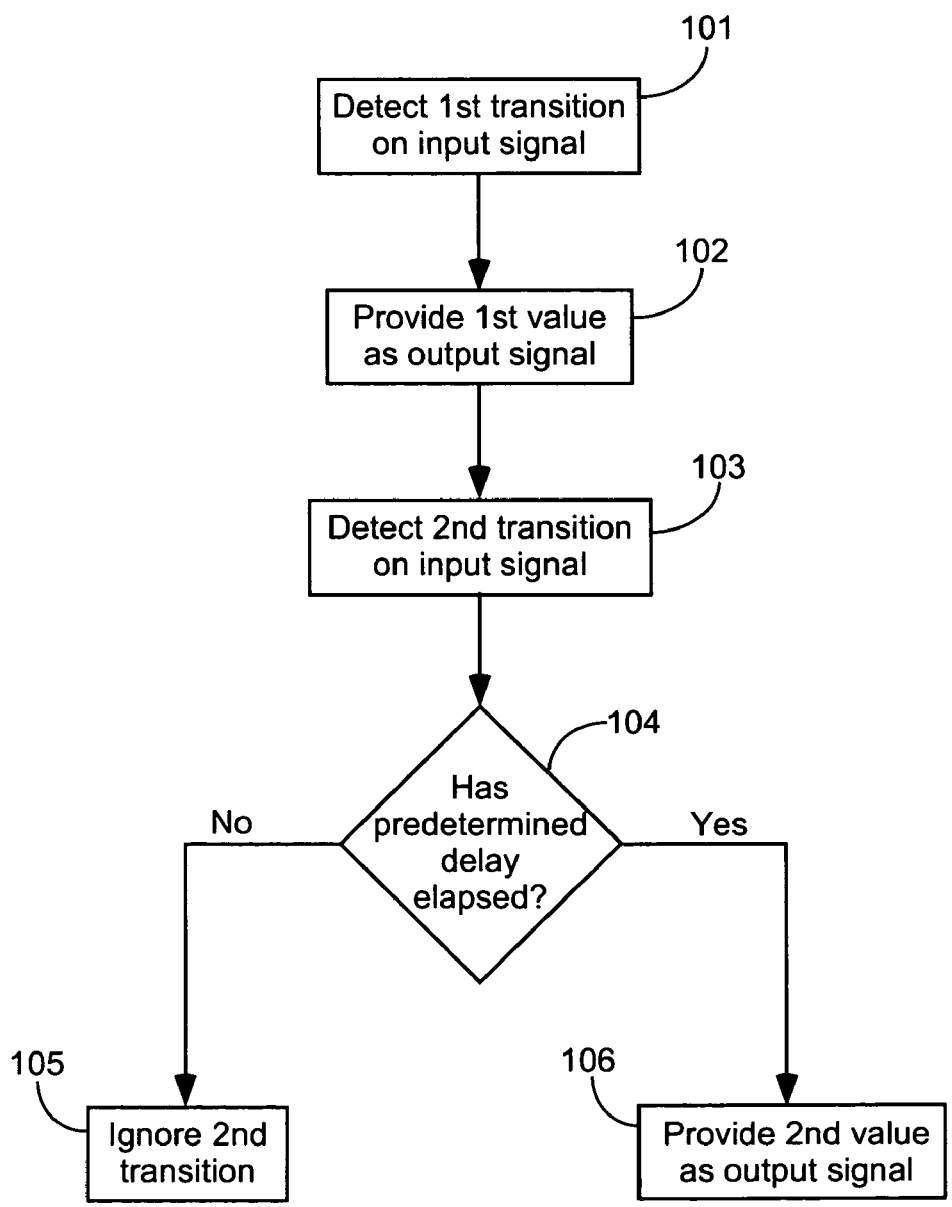
FIG. 1 illustrates the steps of a first exemplary method of suppressing glitches on an input signal.

FIG. 1 illustrates the steps of a first exemplary method of suppressing glitches on an input signal, according to one embodiment of the present invention. The steps of the illustrated method show one way in which a first transition (e.g., 702 shown in FIG. 3) on an input signal 704 can trigger a condition in which subsequent transitions 706 and 708 are ignored for a predetermined time 710. This predetermined time 710 can be made long enough, for example, to ensure that a slowly-transitioning input signal 704 generates only one effective clock transition 712 even when the input signal 704 passes several times through the input threshold 714.

In step 101, a first transition is detected on an input signal, e.g., an input clock signal. In step 102, the input value is provided as an output signal. In some embodiments, the first value is stored in a latch which then provides the output signal. In step 103, a second transition is detected on the input signal. If a predetermined delay has not yet elapsed since the first transition (see decision step 104), the second transition is ignored (step 105). If the predetermined delay has elapsed since the first transition (step 104), the new input value is passed on to the output terminal (step 106).

Figure 2:
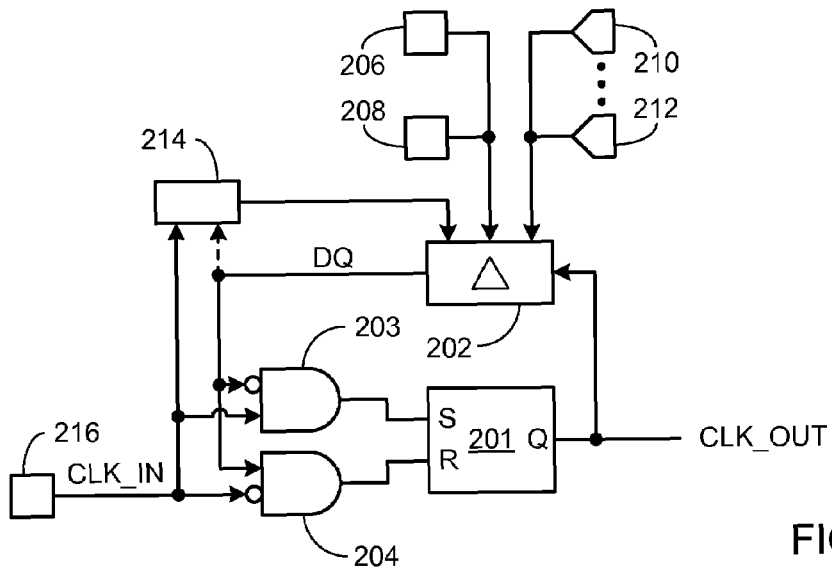
FIG. 2 is a block diagram of a first clock buffer circuit, according to one embodiment of the present invention.

FIG. 2 is a block diagram of a first clock buffer circuit that can be used, for example, to implement the method of FIG. 1. (However, note that the method of FIG. 1 also describes the operation of the circuits of FIGS. 4 and 5, for example, and that this method can be implemented using many different circuits not illustrated herein.) The buffer circuit of FIG. 2 includes a set-reset latch 201, a non-inverting delay element 202, and AND-gates 203 and 204, coupled together as shown in FIG. 2. In the pictured embodiment, the set and reset inputs of latch 201 are active-high, e.g., a high value on the set terminal S stores a "1" value in the latch and forces output signal Q high, while a high value on the reset terminal R stores a low value in the latch and forces output Q low. As is well known, a "bubble" on the input of an AND-gate, for example, indicates that an inversion of the input signal is used as the input to the logic gate.

Set-reset latch 201 can be implemented using any latch having a set-reset function. Many such latches will be known to those of skill in the relevant arts. Delay element 202 can also be implemented in various ways. For example, delay element 202 can be implemented as a string including an even number of inverters. When the buffer circuit is included in a programmable logic device (PLD), delay element 202 can be implemented by routing output signal CLK_OUT through various interconnect elements and back to AND-gates 203 and 204, or back to a lookup table in which gates 203 and 204 have been implemented, for example. Additionally or alternatively, a delay element 202 in a PLD can be implemented by routing delays (e.g., wires) or by routing through one or more lookup tables, or other logic elements.

In some embodiments, e.g., when the buffer circuit is included in a PLD, delay element 202 has a programmable delay that can be controlled, for example, by configuration memory cells 206 of the PLD. In other embodiments, the delay is pin-selectable, e.g., selected from among a plurality of supported values by means of one or more device pins 210 through 212 tied to high or low values. For example, when a test mode pin 210 is tied high for testing an IC, the IC is typically operated at a higher frequency than the usual operating frequency, e.g., 100 megahertz (MHz) rather than 20 MHz. Therefore, in one embodiment it might be desirable to reduce the delay through the delay element 202 when the test mode pin 210 is tied high.

One possible approach is to limit the length of the time delay to no more than half the clock period. For example, if the maximum clock frequency is 100 MHz, the delay through the delay element could be limited to no more than 5 nanoseconds (ns), e.g., 2-3 ns. In some embodiments, the delay element has an adaptive delay that varies with a frequency of the input signal. For example, the higher the frequency of the input signal, the shorter the delay of the delay element 202. In some such embodiments, the buffer circuit includes a frequency sensor 214 that measures the frequency of the input signal (or the output signal, or the delayed output signal) and adapts the delay through the delay element 202 accordingly.

Some self-configuring PLDs have configuration bitstreams that include a "speed-up bit" 208. Configuration occurs at a slower rate at the beginning of the configuration process. If a particular bit value is detected at a predetermined position in the configuration bitstream, the configuration clock generated by the PLD 216 will be sped up to a higher value. When the clock buffer circuits of the present invention are used to buffer such a configuration clock, the delay element 202 can be designed to respond to this bit detection by reducing the value of the delay through the delay element 202, to accommodate the increase in the speed of the configuration clock.

It will be clear to those of skill in the art that the invention can be implemented within these and other functional and architectural variations.

Figure 3:
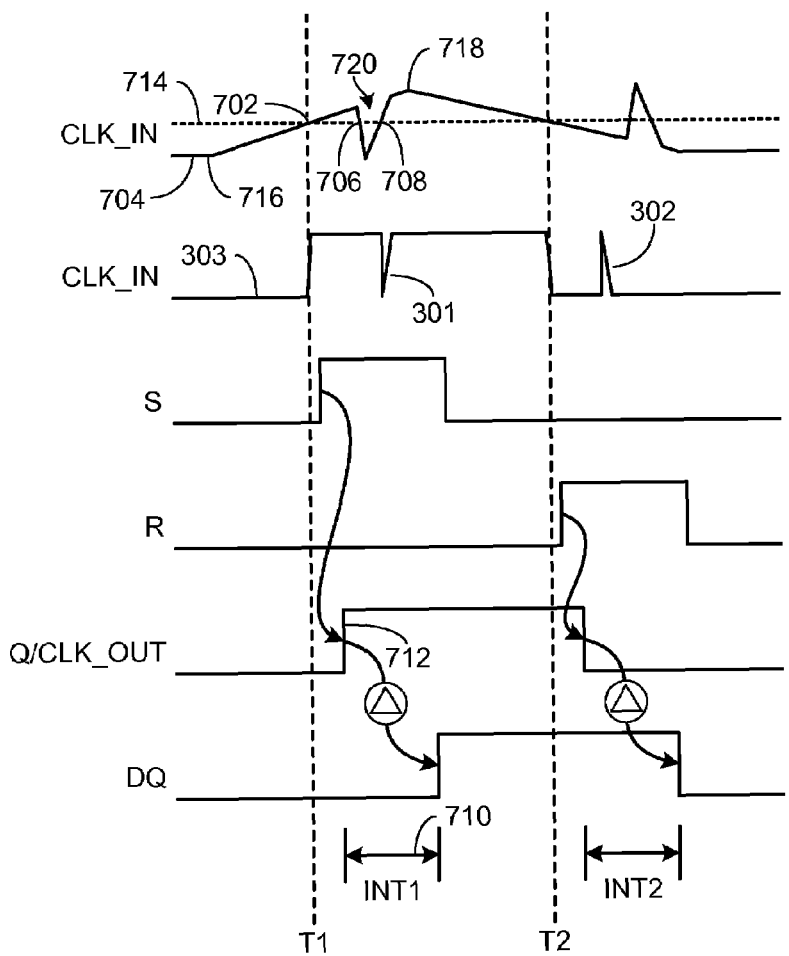
FIG. 3 is a timing diagram illustrating the operation of the circuit of FIG. 2.

FIG. 3 is a timing diagram illustrating the functionality of the circuit of FIG. 2. As shown in FIG. 3, an input signal CLK_IN and an output signal CLK_OUT (which is the same as signal Q from the latch) are initially both at a first value (e.g., low). A delayed output signal DQ is also low. The set signal S and reset signal R are both low, so the latch 201 retains a previously-stored low value at output terminal Q. (Note that In the present specification, the same reference characters are used to refer to terminals, signal lines, and their corresponding signals.)

At time T1, a first transition (e.g., a rising edge) on the input signal CLK_IN causes AND-gate 203 to drive a high value onto set signal S. A high value is stored in latch 201, and signal CLK_OUT goes high, as shown in FIG. 3. After a time delay INT1 determined by delay element 202, delayed output signal DQ also goes high. The high value on signal DQ drives set signal S low again.

In the exemplary waveforms of FIG. 3, a "low glitch" 301 occurs on the input signal CLK_IN after output signal CLK_OUT goes high, and before the delayed output signal DQ goes high. During the glitch, signal CLK_IN goes low. However, delayed output signal DQ is still low, so AND-gate 204 continues to drive a low value onto reset signal R, and the value stored in latch 201 does not change. In effect, the reset mechanism is disabled for a time period INT1 after a rising edge on signal CLIK_IN.

At time T2, a second transition (e.g., a falling edge) on the input signal CLK_IN causes AND-gate 204 to drive a high value onto reset signal R. A low value is stored in latch 201, and signal CLK_OUT goes low, as shown in FIG. 3. After a time delay INT2 determined by delay element 202, delayed output signal DQ also goes low. (Time delay INT2 may be the same as, or different from, time delay INT1, depending on the properties of delay element 202.) The low value on signal DQ drives reset signal R low again.

In the exemplary waveforms of FIG. 3, a "high glitch" 302 occurs on the input signal CLK_IN after output signal CLK_OUT goes low, and before the delayed output signal DQ goes low. During the glitch, signal CLK_IN goes high. However, delayed output signal DQ is still high, so AND-gate 203 continues to drive a low value onto set signal S, and the value stored in latch 201 does not change. In effect, the set mechanism is disabled for a time period INT2 after a falling edge on signal CLK_IN.

Note that this circuit may be especially useful in cases where the input signal CLK_IN does not have fast signal transitions such as those shown in FIG. 3. For example, if in FIG. 7 the input signal CLK_IN 704 transitions slowly from a low value 716 to a high value 718, a glitch, such as glitch 720 or glitch 301 may be more likely to occur. However, the operation of the circuit is still similar to that shown in FIG. 3, as will be clear to those of skill in the art. In other embodiments, the input signal CLK_IN may have very fast signal transitions, causing reflections that can also result in double pulsing.

Figure 4:
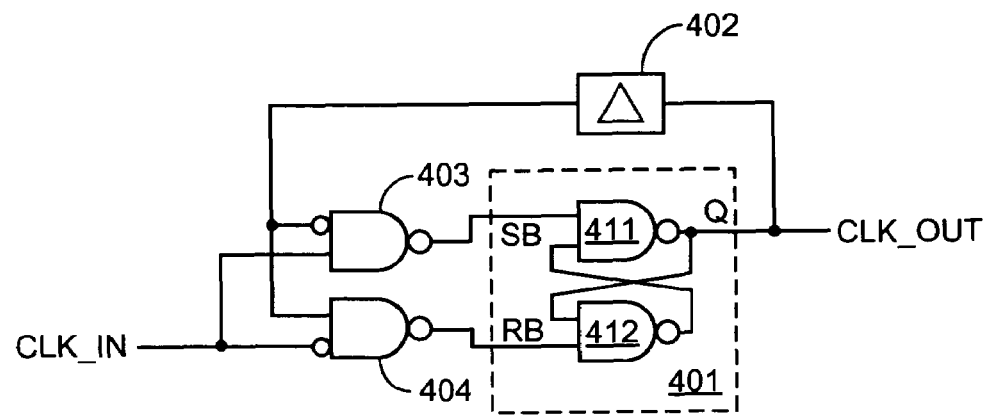
FIG. 4 is a schematic diagram of a second clock buffer circuit, according to one embodiment of the present invention.

FIG. 4 is a schematic diagram of a second clock buffer circuit, according to another embodiment of the present invention. The buffer circuit of FIG. 4 includes a set-reset latch 401, a non-inverting delay element 402, and NAND-gates 403 and 404, coupled together as shown in FIG. 2. Delay element 402 can be implemented, for example, in any of the ways described above in connection with delay element 202. In the pictured embodiment, latch 401 includes two cross-coupled NAND gates 411 and 412. The set and reset inputs of latch 401 (labeled "SB" and "RB", respectively) are active-low, e.g., a low value on the set terminal SB stores a "1" value in the latch and forces output signal Q high, while a low value on the reset terminal RB stores a low value in the latch and forces output Q low. As will be clear to those of skill in the art, the buffer circuit of FIG. 4 functions in a similar fashion to the circuit shown in FIG. 2.

Figure 5:
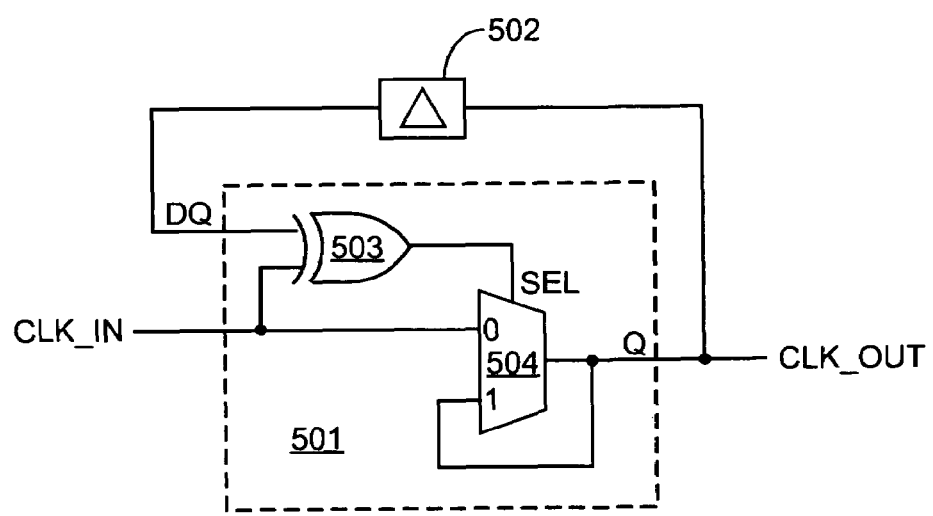
FIG. 5 is a schematic diagram of a third clock buffer circuit, according to one embodiment of the present invention.

FIG. 5 illustrates a different clock buffer circuit, in accordance with another embodiment of the present invention. In the embodiment of FIG. 5, the clock buffer circuit includes a latch 501 and a delay element 502, coupled together as shown in FIG. 5. Delay element 502 can be implemented, for example, in any of the ways described above in connection with delay element 202. Latch 501 includes a multiplexer 504 and an exclusive-OR gate 503 coupled to control the operation of multiplexer 504. When delayed output signal DO is the same as input signal CLK_IN, multiplexer 504 selects signal CLK_IN as the output signal Q. When delayed output signal DQ is different from input signal CLK_IN, the multiplexer retains (latches) the output value Q, i.e., transitions on input signal CLK_IN are ignored.

Figure 6:
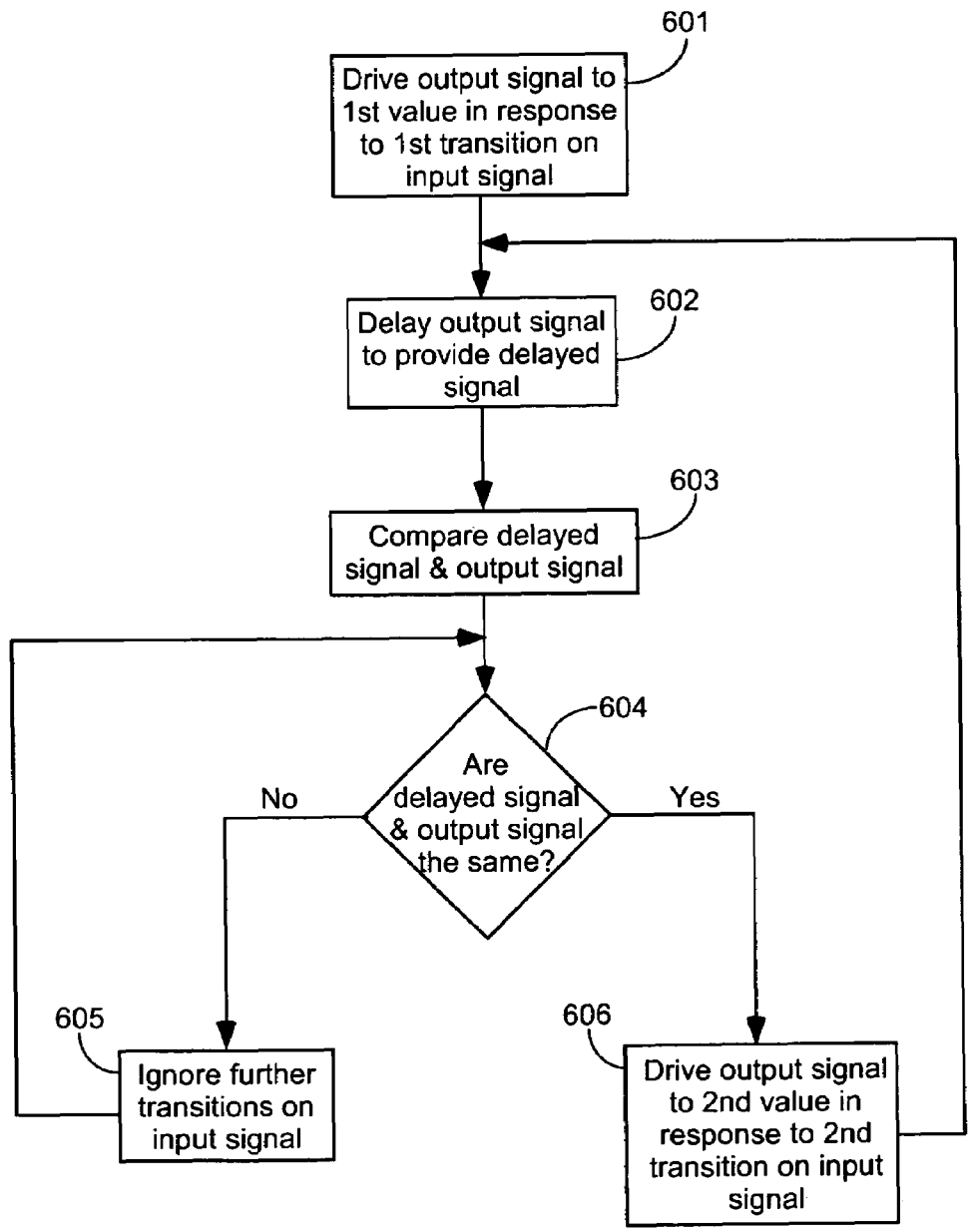
FIG. 6 illustrates the steps of a second exemplary method of suppressing glitches on an input signal.

FIG. 6 shows the operation of the circuit of FIG. 5 in method form. However, the method of FIG. 6 also describes the operation of the circuits of FIGS. 2 and 4, for example. Further, note that the methods described in FIGS. 1 and 6 are actually two ways of looking at what can be the same process. Either of these methods can be implemented using any of the circuits illustrated herein, or using many other circuits not so illustrated.

In step 601, the output signal (e.g., signal CLK_OUT) is driven to a first value in response to a first transition on the input signal (e.g., signal CLK_IN). In step 602, the output signal is delayed (e.g., by delay element 502), to provide a delayed signal (e.g., signal DQ). The delayed signal and the output signal are compared in step 603. If the delayed signal and the output signal are the same, the output signal is driven to a second value in response to a second transition on the input signal, and the method resumes at step 602 by delaying the new output signal. If the delayed signal and the output signal are different, further transitions on the input signal are ignored (step 605) until the time comes when the delayed signal and the output signal are again the same (as detected in step 604).

The truth table shown in Table 1 applies to the circuits of FIGS. 2, 4, and 5.

TABLE 1

| Q | DQ | CLK_IN | CLK_OUT/Q |           | Q | DQ | CLK_IN | CLK_OUT/Q |
|---|----|--------|-----------|-----------|---|----|--------|-----------|
| 0 | 0  | 0      | 0         |           |   |    |        |           |
| 0 | 0  | 1      | 1         | forced to:| 1 | 0  | 1      | 1         |
| 0 | 1  | 0      | 0         |           |   |    |        |           |
| 0 | 1  | 1      | 0         |           |   |    |        |           |
| 1 | 0  | 0      | 1         |           |   |    |        |           |
| 1 | 0  | 1      | 1         |           |   |    |        |           |
| 1 | 1  | 0      | 0         | forced to:| 0 | 1  | 0      | 0         |
| 1 | 1  | 1      | 1         |           |   |    |        |           |

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems. For example, the glitch suppression can be accomplished using one or more monostable circuits instead of a latch, as will be clear to those of skill in the art.

Further, latches, set-reset latches, delay elements, AND-gates, NAND-gates, exclusive OR gates, multiplexers, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A method of suppressing a plurality of undesirable glitches on an input signal in an integrated circuit, the method comprising:
   generating the input signal;
   distributing the input signal for the integrated circuit, wherein the input signal in the integrated circuit includes a plurality of transitions and the undesirable glitches, each undesirable glitch including a rising and falling transition through a threshold of the input signal;
   detecting a first one of the transitions on the input signal;
   providing, responsive to the first transition, a first value as an output signal;
   generating a delay period in response to the first transition;
   ignoring the rising and falling transitions of at least one of the undesirable glitches on the input signal when the rising and falling transitions occur during the delay period after the first transition;
   detecting a second one of the transitions on the input signal; and
   providing, responsive to the second transition, a second value as the output signal when the second transition occurs after the delay period after the first transition, wherein the second value is different from the first value,
   wherein the input signal comprises an input clock signal, and the output signal comprises an output clock signal; and wherein the generating of the delay period includes measuring a frequency of the input clock signal and varying the delay period in response to the frequency of the input clock signal.

2. The method of claim 1,
wherein the providing of the first value comprises storing the first value in a latch providing the output signal, wherein a reset mechanism of the latch is disabled during the delay period and the reset mechanism is enabled after the delay period has expired,
wherein the ignoring of the rising and falling transitions includes ignoring the at least one of the undesirable glitches in the input signal in response to the reset mechanism being disabled;
wherein the providing of the second value comprises storing the second value in the latch, wherein the second value is stored in response to the reset mechanism being enabled after the delay period has expired.

3. The method of claim 2, wherein the latch comprises a set-reset latch.

4. The method of claim 3, wherein the latch comprises two cross-coupled NAND gates.

5. The method of claim 2, wherein the latch comprises a multiplexer and an exclusive-OR gate coupled to control operation of the multiplexer.

6. The method of claim 1, wherein the integrated circuit comprises a programmable integrated circuit (IC), and the generating of the delay period includes programming the programmable IC to route the output signal through programmable elements of the programmable IC.

7. The method of claim 6, wherein the programmable elements comprise routing elements.

8. The method of claim 6, wherein the programmable elements comprise lookup tables.

9. The method of claim 6, wherein the generating of the delay period includes adjusting the delay period in response to at least one value of at least one pin and at least one configuration memory cell of the programmable IC, the at least one pin including a test mode pin for selecting between testing and usual operation of the programmable IC with the delay value in testing operation being reduced from the delay value in usual operation, the at least one configuration memory cell including a configuration memory cell for storing a speed-up bit for selecting between a slower and an increased rate of the input signal that is a configuration clock of the programmable IC with the delay value for the increased rate being reduced from the delay value for the slower rate.

10. A method of suppressing a plurality of undesirable glitches on an input signal in an integrated circuit, the method comprising:
generating the input signal;
distributing the input signal for the integrated circuit, wherein the input signal in the integrated circuit includes a plurality of transitions and the undesirable glitches, each undesirable glitch including a rising and falling transition through a threshold of the input signal;
driving an output signal to a first value in response to a first one of the transitions on the input signal;
delaying the output signal to provide a delayed signal;
comparing the delayed signal and the output signal;
ignoring the rising and falling transitions of at least one of the undesirable glitches on the input signal when the comparing shows that the output signal and the delayed signal are different; and
driving the output signal to a second value in response to a second one of the transitions on the input signal when the comparing shows that the output signal and the delayed signal are the same, wherein the second value is different from the first value,
wherein the input signal comprises an input clock signal, and the output signal comprises an output clock signal; and
wherein the delaying of the output clock signal includes measuring a frequency of the input clock signal and adjusting an amount of the delaying of the output clock signal in response to the frequency of the input clock signal.

11. The method of claim 10,
wherein driving the output signal to the first value comprises storing the first value in a latch providing the output signal;
wherein driving the output signal to the second value comprises storing the second value in the latch; and
wherein transitions on the input signal are ignored by disabling a reset mechanism of the latch in response to the comparing showing that the output signal and the delayed signal are different, and wherein the reset mechanism is enabled in response to the comparing showing that the output signal and the delayed signal are the same.

12. The method of claim 11, wherein the latch comprises a set-reset latch.

13. The method of claim 12, wherein the latch comprises two cross-coupled NAND gates.

14. The method of claim 11, wherein the latch comprises a multiplexer and an exclusive-OR gate coupled to control operation of the multiplexer.

15. The method of claim 10, wherein the integrated circuit comprises a programmable integrated circuit (IC), and the delaying of the output signal includes programming the programmable IC to route the output signal through programmable elements of the programmable IC.

16. The method of claim 15, wherein the programmable elements comprise routing elements.

17. The method of claim 15, wherein the programmable elements comprise lookup tables.

18. The method of claim 15, wherein the delaying of the output clock signal includes adjusting an amount of the delaying of the output clock signal in response to at least one value of at least one pin and at least one configuration memory cell of the programmable IC, the at least one pin including a test mode pin for selecting between testing and usual operation of the programmable IC with the amount in testing operation being reduced from the amount in usual operation, the at least one configuration memory cell including a configuration memory cell for storing a speed-up bit for selecting between a slower and an increased rate of the input signal that is a configuration clock of the programmable IC with the amount for the increased rate being reduced from the amount for the slower rate.

* * * * *